United States Patent [19]
Hall et al.

[11] Patent Number: 5,184,768
[45] Date of Patent: Feb. 9, 1993

[54] SOLDER INTERCONNECTION VERIFICATION

[75] Inventors: Robert S. Hall, Barrington Hills, Ill.; Glenn F. Urbish, Coral Springs; William B. Mullen, III, Boca Raton, both of Fla.

[73] Assignee: Motorola, Inc., Schaumburg, Ill.

[21] Appl. No.: 619,944

[22] Filed: Nov. 29, 1990

[51] Int. Cl.⁵ .............................................. H05K 3/34
[52] U.S. Cl. .................................... 228/104; 228/105
[58] Field of Search ....................... 228/103, 104, 105

[56] References Cited

U.S. PATENT DOCUMENTS

| | | | |
|---|---|---|---|
| 4,457,467 | 7/1984 | Klement et al. | 228/105 |
| 4,941,256 | 7/1990 | Capson et al. | 228/103 |
| 4,944,447 | 7/1990 | Thome | 228/103 |
| 5,012,502 | 4/1991 | Battin et al. | 228/103 |

Primary Examiner—Samuel M. Heinrich
Attorney, Agent, or Firm—Dale W. Dorinski

[57] ABSTRACT

A solder interconnection verification system is used in verifying the formation of solder joints which are hidden from view under a component (25). Solder material (28) is attached or reflow soldered to component solder pads (26). The substrate solder pads (22) have a small solderable portion (24) attached to, and extending outward from, the solder pads (22). The component is placed on the substrate (20) and reflow soldered to wet the solder (38) to the substrate solder pads (32 and 34), creating an irregularly shaped solder joint (38). The joint (38) thus formed is inspected using x-rays after reflow.

28 Claims, 4 Drawing Sheets

SOLDER INTERCONNECTION VERIFICATION

TECHNICAL FIELD

This invention relates generally to soldering techniques, and more particularly to soldering of electronic components, and is most suited to leadless electronic components having solder joints which are hidden from the prying eye.

BACKGROUND

Reflow soldering of electronic components to substrates typically employs the use of a heated oven or platen. Specific temperature profiles are required to control and properly reflow the solder to achieve sound, uniform solder joints. Those profiles must be closely controlled and maintained in order to accommodate variations in thermal mass of the substrate and components.

If the profile of the oven or platen changes, the component mass or the mass of a substrate changes, the solderability of the component or the substrate changes, the soldering process may yield unacceptable results. To avoid having to rework or scrap product, the soldering process is periodically monitored by visual inspection. Inspection attempts to control the soldering process by periodically sampling the substrates and visually inspecting the soldered connections. The visual inspection step is usually performed after the soldering process is complete and checks for solder bridges, solder balls and incomplete solder connections which may result from insufficient solder or an unsolderable surface. This method has limited use because it samples only a small percentage of assemblies, does not provide individual substrate information and requires an extra production step.

Other solder joint verification methods employing automated optical inspection equipment attempt to control the soldering process by inspecting individual solder connections. This method detects soldering defects such as porosity, solder bridges, solder balls and solder intermittents or opens. Automated visual inspection yields data on every solder joint and every substrate without additional production steps. However, it only measures the amount and location of the solder and cannot determine whether the solder has properly reflowed or formed a metallurgical interconnection.

Other means of solder joint inspection have been proposed in the literature. For example, so solder joint verification method employing automated inspection equipment is disclosed by Thome in U.S. Pat. No. 4,944,447 entitled "Bonding Verification Process Incorporating Test Patterns." This method utilizes test patterns strategically placed on the substrate and covered with solder paste prior to reflow. By positioning the test patterns near the component solder connections, it is assumed that the test patterns will mimic the quality of the component solder connection.

After reflowing, the test patterns may be visually inspected to verify that the solder has properly reflowed to the test pattern. This method provides generic information for the soldering performance of the substrate, however it fails to provide data for individual solder connections because the test patterns are not the actual interconnection between the component and the substrate, and the mean or generic performance is not reflective of all individuals. In addition, this method does not provide information on solder joints that are under components or otherwise hidden from view, and may not form a proper solder joint due to any one of the aforementioned reasons. Solder surfaces which are obscured to the prying eye, for example those underneath components such as a pad array chip carrier or semiconductor device, are unable to be inspected visually. It is impossible, without destructive analysis, to determine whether the solder joint on a pad array chip carrier has wetted to the substrate, perhaps leaving an open or intermittent connection. Inspection of these hidden solder joints by conventional x-ray methods only verifies the presence or absence of solder material and cannot indicate whether a proper solder interconnection has formed between the component and the substrate.

Referring to FIG. 1A, pad array chip carrier solder interconnections as practiced in the prior art employ substantially circular solder pads 12 on both the substrate 10 and the component 15. After the solder is reflowed and wetted to the substrate solder pads 12 and the component solder pads 16, a proper solder joint 18 is formed. If the solder fails to wet to either the solder pad of the component or the solder pad of the substrate because of surface contamination, improper solder mass, or improper solder fluxing, the resulting solder interconnection 19 does not provide an electrical connection between the component 15 and the substrate 10. Detection of this occurrence with conventional inspection techniques is impossible, and x-ray analysis of the solder joint is required. An x-ray image of the soldered connection in FIG. 1B shows that there is no difference between the improper solder connection 19 and the proper solder connections 18.

Due to the extremely high number of solder joints and the extremely high yields required in processes utilizing pad array chip carriers, the desire to effectively analyze the solder joint without destroying the assembly becomes of high interest. Present methods of controlling solder joint reflow profiles by inspecting the metallurgical joint are clearly inadequate for processes requiring extremely high yields. Statistical sampling of a small fraction of solder joints can never provide the information required to achieve extremely high-yielding solder interconnections, for example solder joint defect levels less than one hundred parts per million (ppm). In addition, all present inspection methods fail to accommodate solder joints under components and do not address the problem of inspection of leadless pad array chip carriers. A need exists for a solder inspection and verification method that will be an integral part of the soldering process, does not require additional production steps, inspects and produces test results for every interconnection on the substrate, verifies proper solder reflow and verifies that each individual interconnection is properly made.

SUMMARY OF THE INVENTION

Briefly, according to the invention, a solder interconnection verification system is provided for use in verifying the formation of solder joints which are hidden from view under a component. Solder material is attached or reflow soldered to the solder pads of a component. The component is placed on the solder pads of a substrate and reflow soldered. The substrate solder pads have a small solder ble portion attached to, and extending outward from, the solder pads. During the reflow process, the solder wets to specially designed solder pads on the substrate, creating an irregularly shaped solder joint. The joint thus formed is inspected by x-ray equipment after reflow.

In an alternate embodiment of the invention, both the substrate solder pads and the component solder pads have small solderable portions attached to, and extending outward from, the solder pads.

In a further embodiment of the invention, solder material is deposited on a substrate having conventional solder pads. The component solder pads have a small solderable portion attached to, and extending outward from, the solder pads. The component is placed on the substrate and reflow soldered. During the reflow process, the solder wets to specially designed solder pads on the component, creating an irregularly shaped solder joint. The joint thus formed is inspected by x-ray equipment after reflow.

DETAILED DESCRIPTION OF THE PREFERRED EMBODIMENT

The solder interconnection verification system is most applicable in situations where reflow soldering is employed. In reflow soldering, a circuit-carrying substrate (typically a printed circuit board, a molded circuit board, or a ceramic circuit board) contains metallization patterns for the circuitry of the electronic assembly. The substrate solder pads are typical of those normally employed in the art with the exception of the solder pads used for interconnection verification. These solder pads are placed in areas where solder joint verification is difficult or impossible to achieve using optical inspection techniques. Components most applicable in the invention are pad array chip carriers or other leadless components having solder joints obscured to the prying eye. Solder material can be solder paste (as in the case of solder material applied to the substrate) or solder spheres (as in the case of solder material applied to the components). Solder spheres applied to pad array chip carriers are found in applications of the controlled collapse chip carrier connection process. The inspection means for verifying the wetting of the solder material to the substrate and the component solder pads typically comprises x-ray inspection equipment. Other inspection methods such as ultrasonic or acoustical microscopy may also be employed. Such equipment may be either manually operated or computer-controlled systems capable of inspecting solder joints.

Figure 1B:
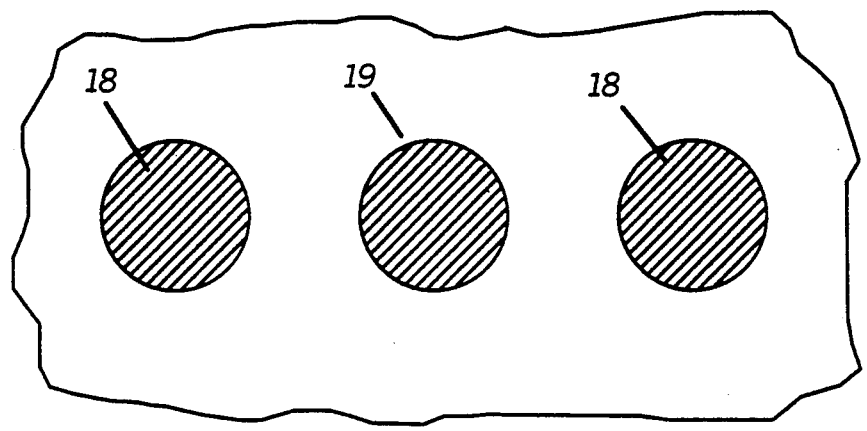
FIG. 1B is an x-ray image plan view of a soldered leadless component as practiced in the prior art.
Figure 1A:
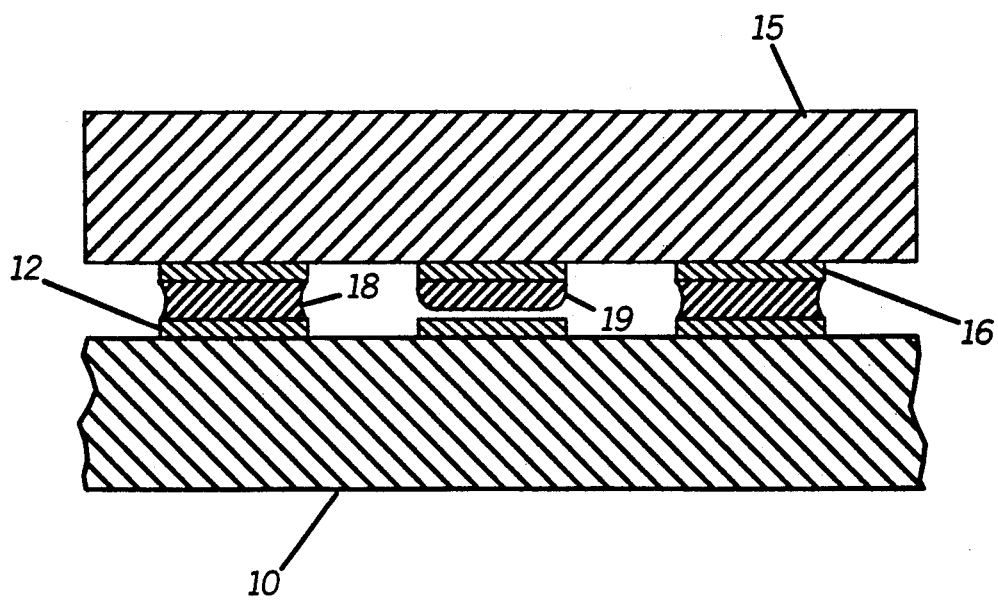
FIG. 1A is a cross-sectional view of a leadless component soldered to a substrate as practiced in the prior art.
Figure 2A:
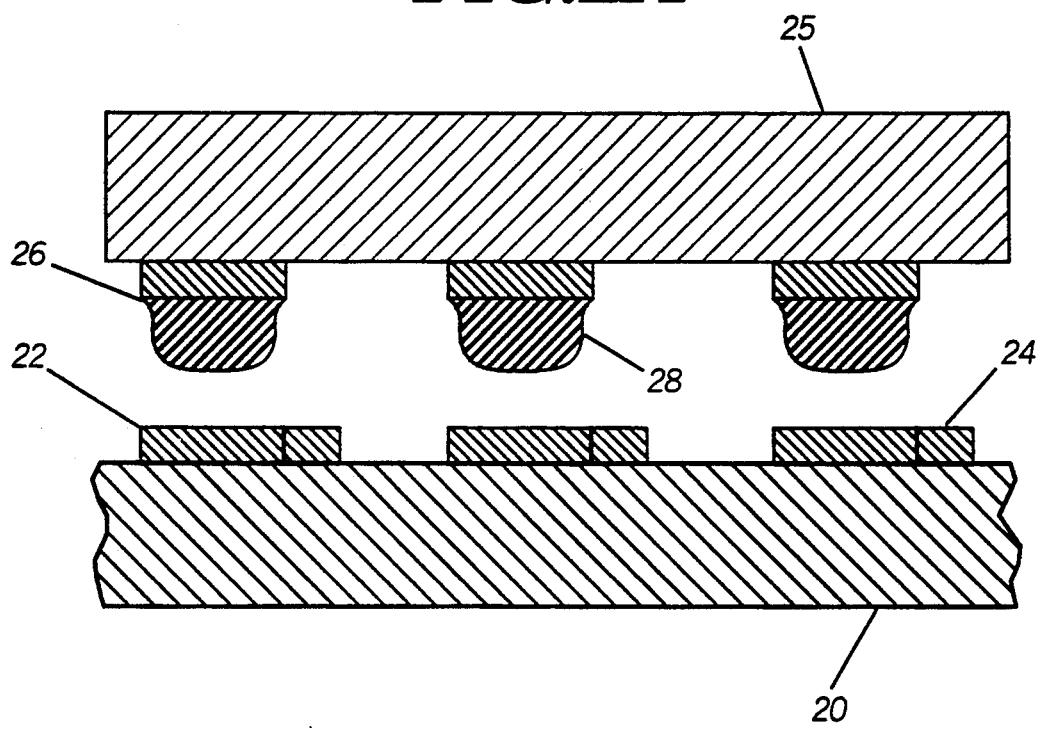
FIG. 2A is a cross-sectional view of a leadless component prior to soldering to a substrate in accordance with the invention.
Figure 2B:
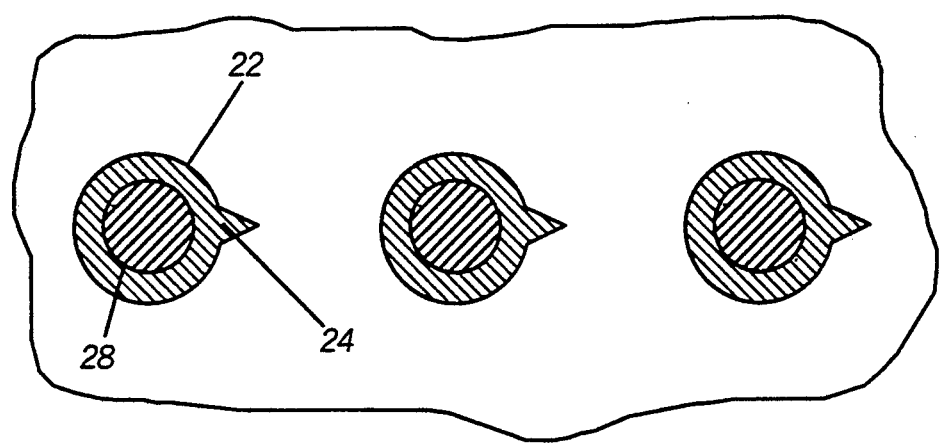
FIG. 2B is an x-ray image plan view of FIG. 2A.

Referring to FIG. 2A, a substrate 20 has solder pads 22 affixed to the surface of the substrate. Each solder pad 22 contains a tab or tabular portion 24 extending beyond the perimeter of the solder pad 22. The portion 24 may be triangular or may assume other shapes advantageous to a particular soldering need such as rounded, rectangular, circular or other polygonal shape. In addition, multiple portions 24 may extend beyond the perimeter of the solder pad 22. A component 25 has solder pads 26 in an array corresponding to the array of solder pads on the substrate 20. Each of the component solder pads 26 has a solder ball or solder sphere 28 affixed to the component solder pad. Solder spheres may be reflowed to the component solder pad 26 or they may be temporarily held in place by using a tacking medium. Methods of fixing the solder spheres in place on the component solder pads are well known to those skilled in the art and may be found, for example, in flip chip process techniques. The component 25 is then placed on the substrate 20 such that the solder spheres 28 of the component are aligned with the solder pads 22 of the substrate and at least some of the solder spheres 28 are touching the substrate solder pads 22. An x-ray image of the assembly is depicted in FIG. 2B, where the solder material 28 is essentially centered about the solder pad 22 of the substrate.

Figure 3A:
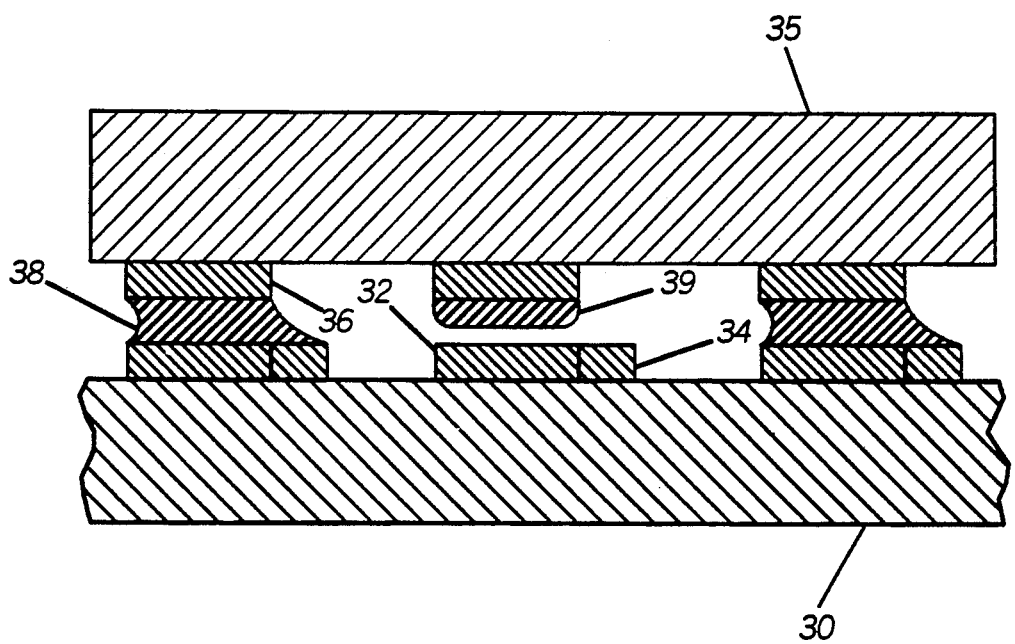
FIG. 3A is a cross-sectional view of a leadless component soldered to a substrate in accordance with the invention.
Figure 3B:
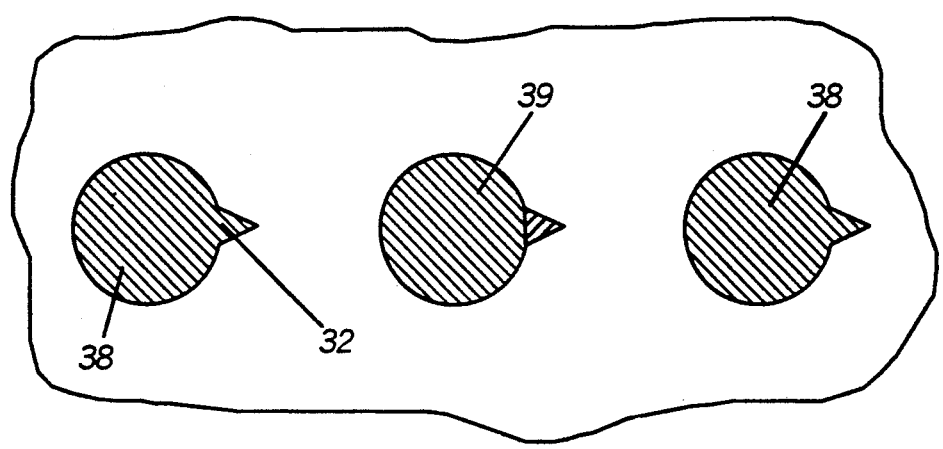
FIG. 3B is an x-ray image plan view of a soldered leadless component in accordance with the invention.

The assembly is then reflowed using an infrared oven, conveyorized heated belt, vapor phase reflow or other reflow techniques known to the art. After reflow, the solder joints 38 in FIG. 3B are wetted to both the component solder pads 36 and the substrate solder pads 32. Note that the cross-sectional profile of a properly wetted solder joint 38 is significantly different from the cross-sectional profile of an improperly formed solder joint 39. The proper solder joint 38 is wet to the substrate solder pad 32, and also to the substrate solder pad extension 34. By inspecting the solder joints using x-ray equipment, the configuration of a properly wet solder joint 38 in FIG. 3B can be seen to be significantly different than the improperly formed solder joint 39. The proper solder joint 38 possesses a shape or profile containing the portion extending beyond the circular solder joint perimeter. An improper solder joint 39 shows only a circular profile and does not contain the portion extending beyond the perimeter.

Figure 4B:
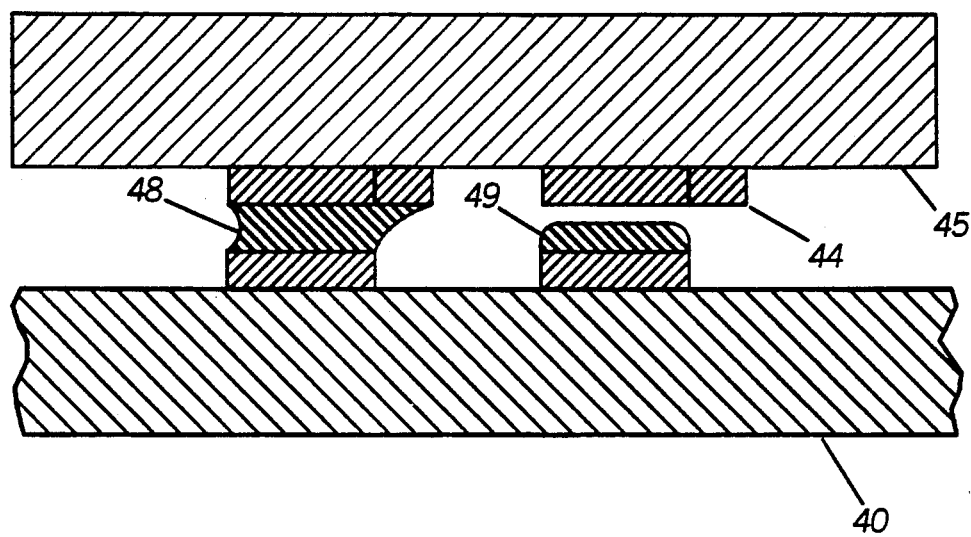
FIG. 4B is a cross-sectional view of a leadless component after soldering to a substrate in an alternate embodiment of the invention.
Figure 4A:
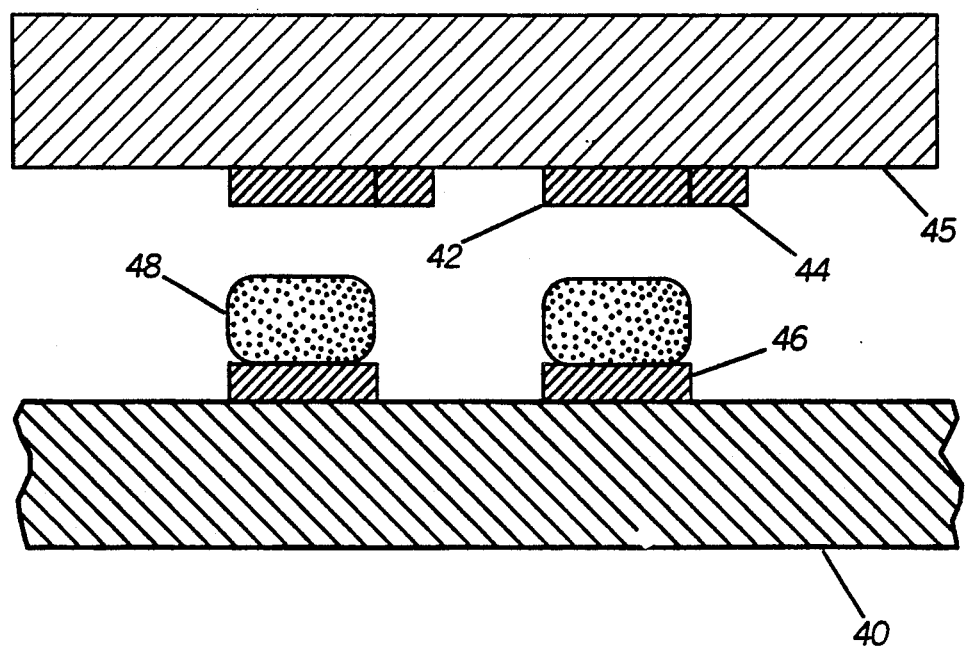
FIG. 4A is a cross-sectional view of a leadless component prior to soldering to a substrate in an alternate embodiment of the invention.

FIG. 4A shows an alternate embodiment of the invention employing solder paste on a substrate. In this case the solder paste 48 is applied to the substrate 40 on the substrate solder pads 46. The solder pads of the substrate are essentially circular and the solder pads of the component contain the extended portion 44. FIG. 4B shows the assembly after the component has been placed on the substrate, reflowed and cooled. Note that the configuration of a properly wetted solder joint 48 is significantly different than the configuration of an improperly wetted solder joint 49. If desired, solder pads on both the component and the substrate can contain tabs or tabular portions extending beyond the circular perimeter of the solder pad. This configuration may be used to determine wetting to both the component solder pads and the substrate solder pads. In this application, the alignment of the extended portions of the solder pads may be the same on both the component and the substrate or may be rotated or juxtaposed to allow the x-ray inspection system to detect the interface where solder wetting has not occurred.

In summary, the present invention provides a method for detecting solder wetting to solder pads under components, which are obscured to optical inspection. During solder reflow the solder material wets over the entire portion of the uniquely designed solder pad to form a uniform coating over both the circular area and the tabular portion extending beyond the circular area. The solder joint thus formed has a profile when viewed from above that is significantly different from solder joints that do not wet to the solder pad. Solder not touching or wetting to the uniquely designed solder pad is easily detected by x-ray inspection. Incorporating the tabular portion into the solder pads permits measurement of the quality of each individual solder joint, as opposed to prior art methods that only serve to measure the wetting of a few test patterns remotely located from the solder joints of interest.

What is claimed is:

1. A solder interconnection verification system, comprising:
    a component having solder pads;
    solder material applied to the component solder pads;
    a substrate having solder pads substantially corresponding to the component solder pads, substantially all of said corresponding substrate solder pads having a solderable portion extending from the solder pads;
    the component being positioned on the substrate such that the component solder pads are substantially aligned with the substrate solder pads;
    heating means for melting the solder material such that the component solder pads are soldered to the substrate solder pads; and
    inspection means for verifying the wetting of the solder material to the substrate solder pads, by inspecting the substrate solder pads after melting the solder material.

2. The solder interconnection verification system of claim 1, wherein all of the corresponding substrate solder pads have a solderable portion extending from the solder pads.

3. The solder interconnection verification system of claim 1, wherein the solder material comprises solder spheres.

4. The solder interconnection verification system of claim 3, wherein the solder spheres are reflowed to the component prior to placement of the component on the substrate.

5. The solder interconnection verification system of claim 4, wherein the component comprises a pad array chip carrier.

6. The solder interconnection verification system of claim 1, wherein substantially all of the component solder pads have a solderable portion extending from the solder pads.

7. The solder interconnection verification system of claim 1, wherein the inspection means comprises x-ray equipment.

8. A solder interconnection verification system, comprising:
    a pad array chip carrier having an array of solder pads, and having solder spheres applied to the solder pads;
    a substrate having a corresponding array of solder pads, substantially all of the array of solder pads having a solderable portion extending from the solder pads;
    the pad array chip carrier being placed on the substrate such that the solder spheres are substantially aligned with and substantially touching the substrate solder pads;
    reflow means to melt the solder spheres such that the pad array chip carrier is soldered to the substrate solder pads; and
    x-ray inspection means for verifying the wetting of the solder spheres to the substrate solder pads, by inspecting the substrate solder pads after reflow of the solder spheres.

9. The solder interconnection verification system of claim 8, wherein all of the corresponding substrate solder pads have a solderable portion extending from the solder pads.

10. The solder interconnection verification system of claim 8, wherein the portion extending from the solder pads is substantially triangular.

11. A method of solder interconnection verification, comprising the steps of:
    applying a solder material to a plurality of solder pads on a component;
    applying the component to a circuit carrying substrate having a plurality of solder pads substantially corresponding to the component solder pads, and the circuit carrying substrate solder pads having a solderable portion extending from the solder pads;
    reflowing the solder material; and
    inspecting the reflowed solder material.

12. The method of solder interconnection verification of claim 11, wherein the step of applying a solder material comprises applying solder spheres.

13. The method of solder interconnection verification of claim 12, wherein the step of applying a component comprises applying a pad array chip carrier.

14. The method of solder interconnection verification of claim 11, wherein the step of inspection comprises inspection by x-ray equipment.

15. A substrate having a plurality of solder pads, the solder pads being substantially circular and having a small solderable portion extending from the solder pads.

16. The substrate of claim 15, wherein all the solder pads have a small solderable portion extending from the solder pads.

17. The substrate of claim 16, wherein the small solderable portions are substantially triangular.

18. A solder interconnection verification system, comprising:
    a substrate having solder pads;
    solder material applied to the substrate solder pads;
    a component being placed on the solder material, the component having solder pads substantially corresponding to the substrate solder pads, and substantially all of the component solder pads having a solderable portion extending partially beyond the solder pad perimeter;
    heating means for melting the solder material such that the component solder pads are soldered to the substrate solder pads; and
    inspection means for verifying the wetting of the solder material to the component solder pads, by inspecting the component solder pads after melting the solder material.

19. The solder interconnection verification system of claim 18, wherein all of the component solder pads have a solderable portion extending partially beyond the solder pad perimeter.

20. The solder interconnection verification system of claim 18, wherein substantially all of the corresponding substrate solder pads have a solderable portion extending partially beyond the solder pad perimeter.

21. The solder interconnection verification system of claim 18, wherein the inspection means comprises x-ray equipment.

22. A method of solder interconnection verification, comprising the steps of:
- applying a solder material to a plurality of solder pads on a circuit carrying substrate;
- applying a component to the circuit carrying substrate, the component having a plurality of solder pads substantially corresponding to the circuit carrying substrate solder pads, and the component solder pads having a solderable portion extending from the solder pads;
- reflowing the solder material; and
- inspecting the reflowed solder material.

23. The method of solder interconnection verification of claim 22, wherein the step of applying a component comprises applying a pad array chip carrier.

24. The method of solder interconnection verification of claim 22, wherein the step of inspection comprises inspection by x-ray equipment.

25. A chip carrier having a plurality of solder pads, substantially all the solder pads being substantially circular and having a small solderable portion extending from the solder pads.

26. The chip carrier of claim 25, wherein all the solder pads have a small solderable portion extending from the solder pads.

27. The chip carrier of claim 25, wherein the small solderable portions are substantially triangular.

28. The chip carrier of claim 25, wherein solder spheres are attached to the solder pads.

* * * * *